US011411309B2

(12) United States Patent
Ling

(10) Patent No.: US 11,411,309 B2
(45) Date of Patent: Aug. 9, 2022

(54) LOCAL OSCILLATOR SPUR SUPPRESSION IN A PHASED ARRAY SYSTEM

(71) Applicant: Maxlinear, Inc., Carlsbad, CA (US)

(72) Inventor: Curtis Ling, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 97 days.

(21) Appl. No.: 16/372,577

(22) Filed: Apr. 2, 2019

(65) Prior Publication Data

US 2019/0305417 A1  Oct. 3, 2019

Related U.S. Application Data

(60) Provisional application No. 62/651,348, filed on Apr. 2, 2018.

(51) Int. Cl.
| | |
|---|---|
| *H01Q 3/26* | (2006.01) |
| *H03L 7/099* | (2006.01) |
| *H01Q 3/36* | (2006.01) |
| *H01Q 21/06* | (2006.01) |

(52) U.S. Cl.
CPC .............. *H01Q 3/2658* (2013.01); *H01Q 3/36* (2013.01); *H01Q 21/061* (2013.01); *H03L 7/099* (2013.01)

(58) Field of Classification Search
CPC .......... H01Q 3/24; H01Q 21/061; H01Q 3/40; H01Q 3/38; H01Q 3/2658; H01Q 3/36; H04B 2001/0425–0475; H04B 7/086; H03L 7/099; H03L 7/1974

See application file for complete search history.

(56) References Cited

U.S. PATENT DOCUMENTS

| | | | |
|---|---|---|---|
| 9,768,852 B2 | 9/2017 | Ling et al. | |
| 9,825,694 B2 | 11/2017 | Gallagher et al. | |
| 10,103,822 B2 | 10/2018 | Ling et al. | |
| 2013/0114771 A1* | 5/2013 | Vavelidis | H03L 7/1974 375/376 |
| 2016/0127027 A1* | 5/2016 | Ling | H01Q 3/267 398/115 |
| 2017/0047932 A1* | 2/2017 | Gopalakrishnan | H03L 7/1974 |
| 2017/0054210 A1* | 2/2017 | Gallagher | H04B 7/18513 |
| 2019/0157756 A1 | 5/2019 | Ling | |

OTHER PUBLICATIONS

U.S. Appl. No. 16/372,569, filed Apr. 2, 2019.
U.S. Appl. No. 16/372,572, filed Apr. 2, 2019.

* cited by examiner

*Primary Examiner* — Ricardo I Magallanes
(74) *Attorney, Agent, or Firm* — Buchalter; Jason W. Croft

(57) ABSTRACT

A system comprises local oscillator spur suppression circuitry, local oscillator generator circuitry), and beamforming circuitry. The local oscillator spur suppression circuitry is operable to generate a phase adjustment value. The local oscillator generator circuitry is operable to generate a local oscillator signal at a determined phase equal to a reference phase offset by the phase adjustment value. The beamforming circuitry is operable to receive the phase adjustment value, and generate a beamforming coefficient to be applied to a signal that is to be upconverted by the local oscillator signal and transmitted via an antenna element of a phased array, wherein the generation of the beamforming coefficient is based on the phase adjustment value and a location of the antenna element within the phased array.

20 Claims, 7 Drawing Sheets

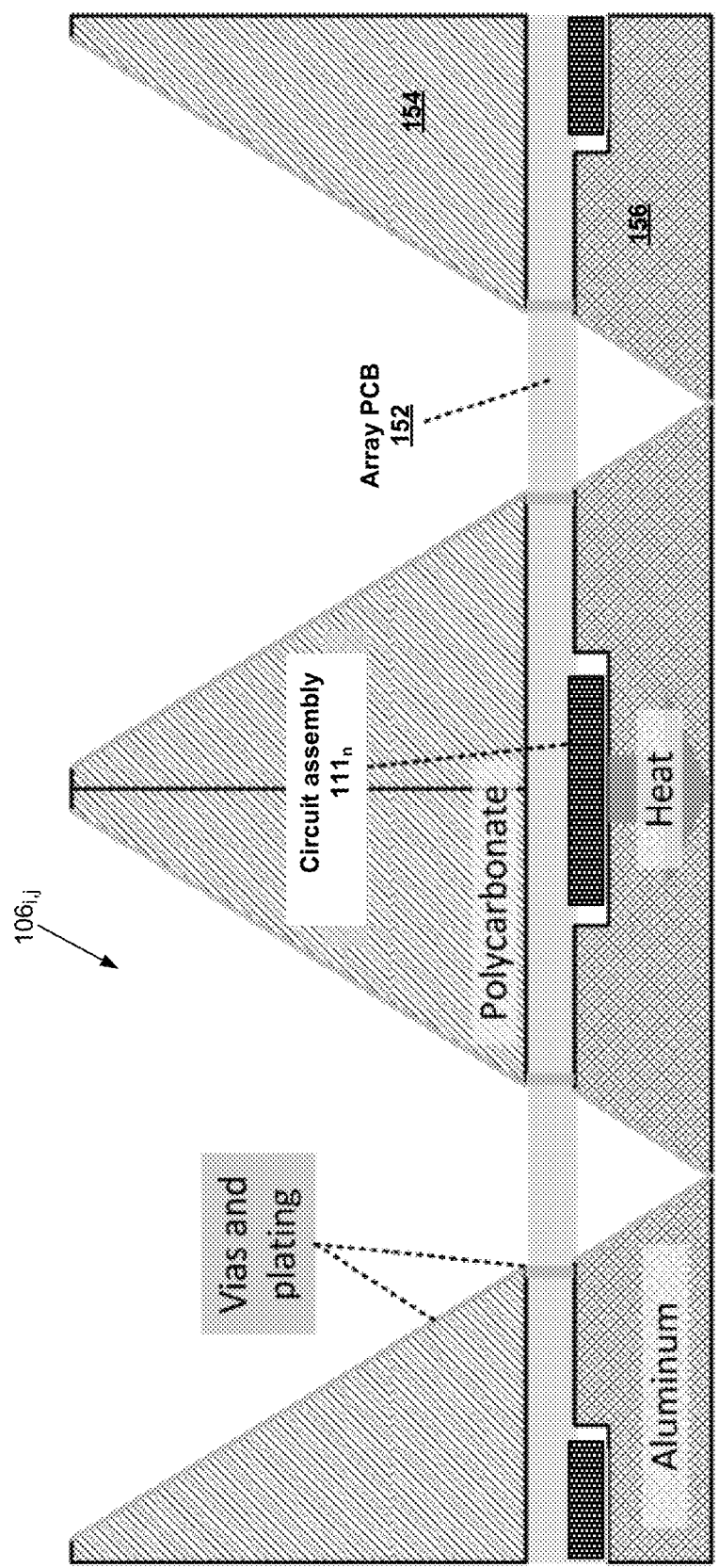

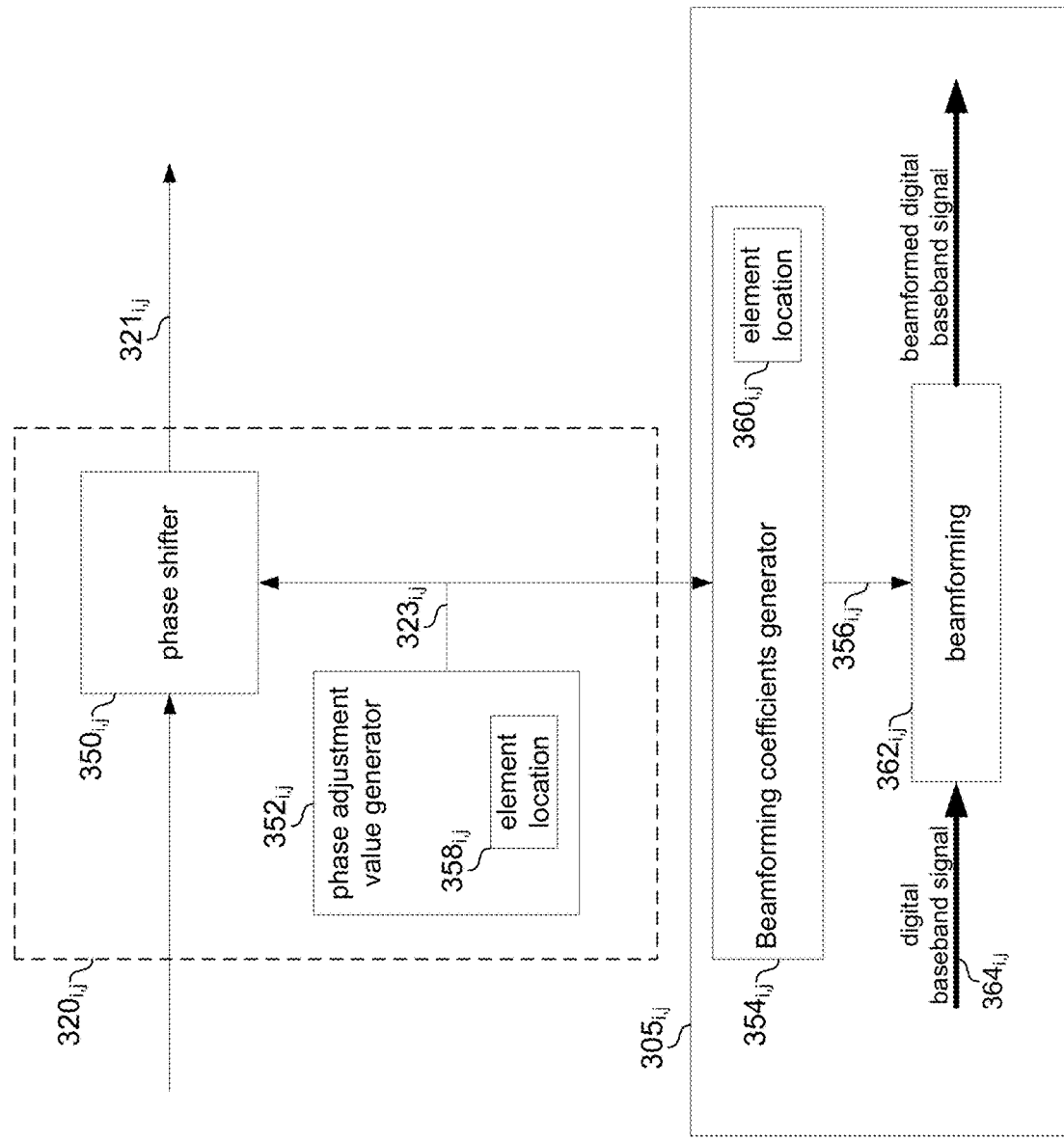

LOCAL OSCILLATOR SPUR SUPPRESSION IN A PHASED ARRAY SYSTEM

PRIORITY CLAIM

This application claims priority to U.S. provisional application 62/651,348 title "Local Oscillator Spur Suppression in a Phased Array System" and filed on Apr. 2, 2018, the entirety of which is hereby incorporated herein by reference.

BACKGROUND

Limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for local oscillator spur suppression in a phase array system, substantially as shown in and/or described in connection with at least one of the figures, as set forth more completely in the claims.

Advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIGS. 1A-1C show an example phased array system.

FIG. 3B illustrates suppression of local oscillator spurs through use of a phase adjustment value, in accordance with aspects of this disclosure.

DETAILED DESCRIPTION OF THE INVENTION

Figure 1A:
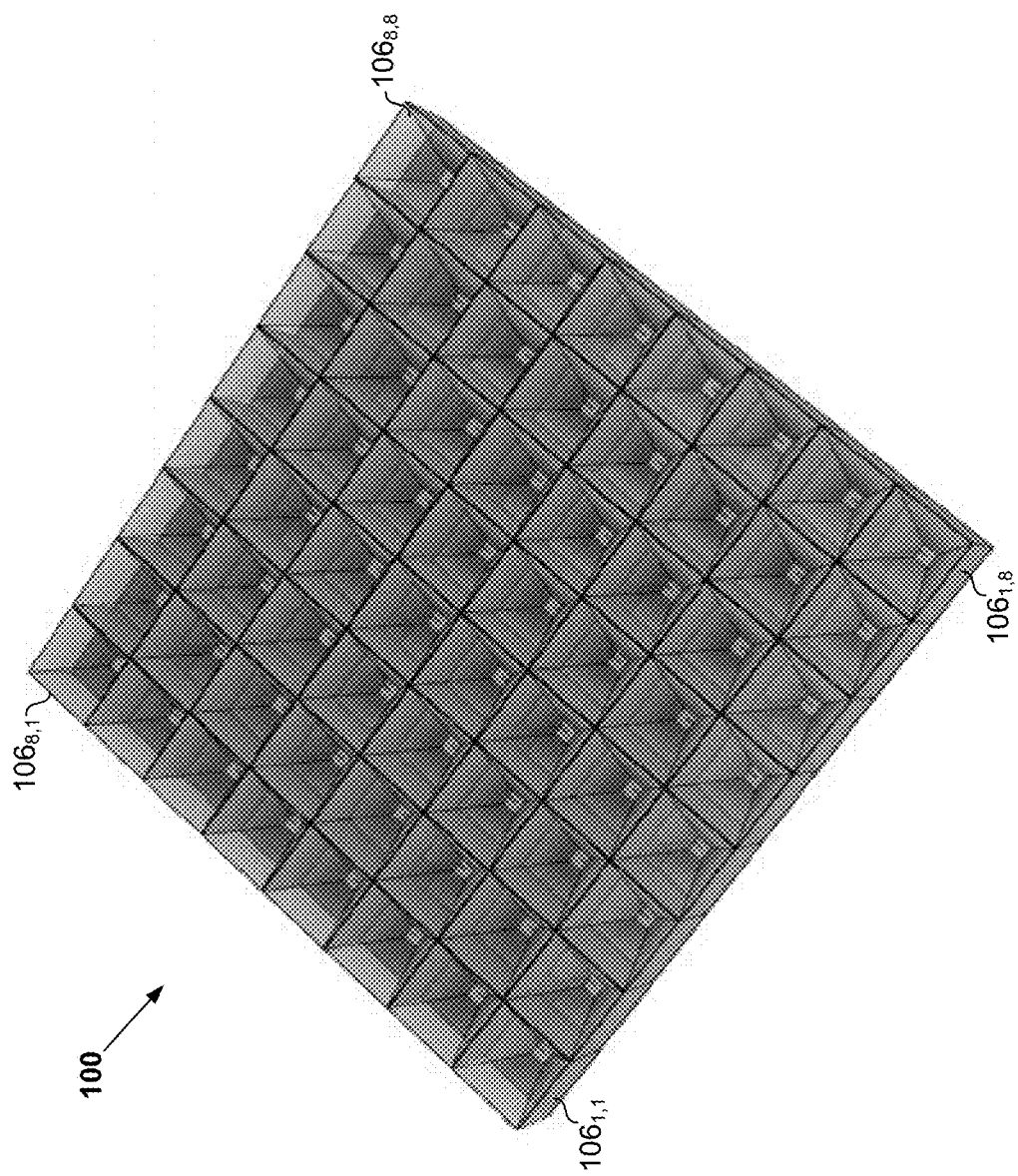
Figure 1B:
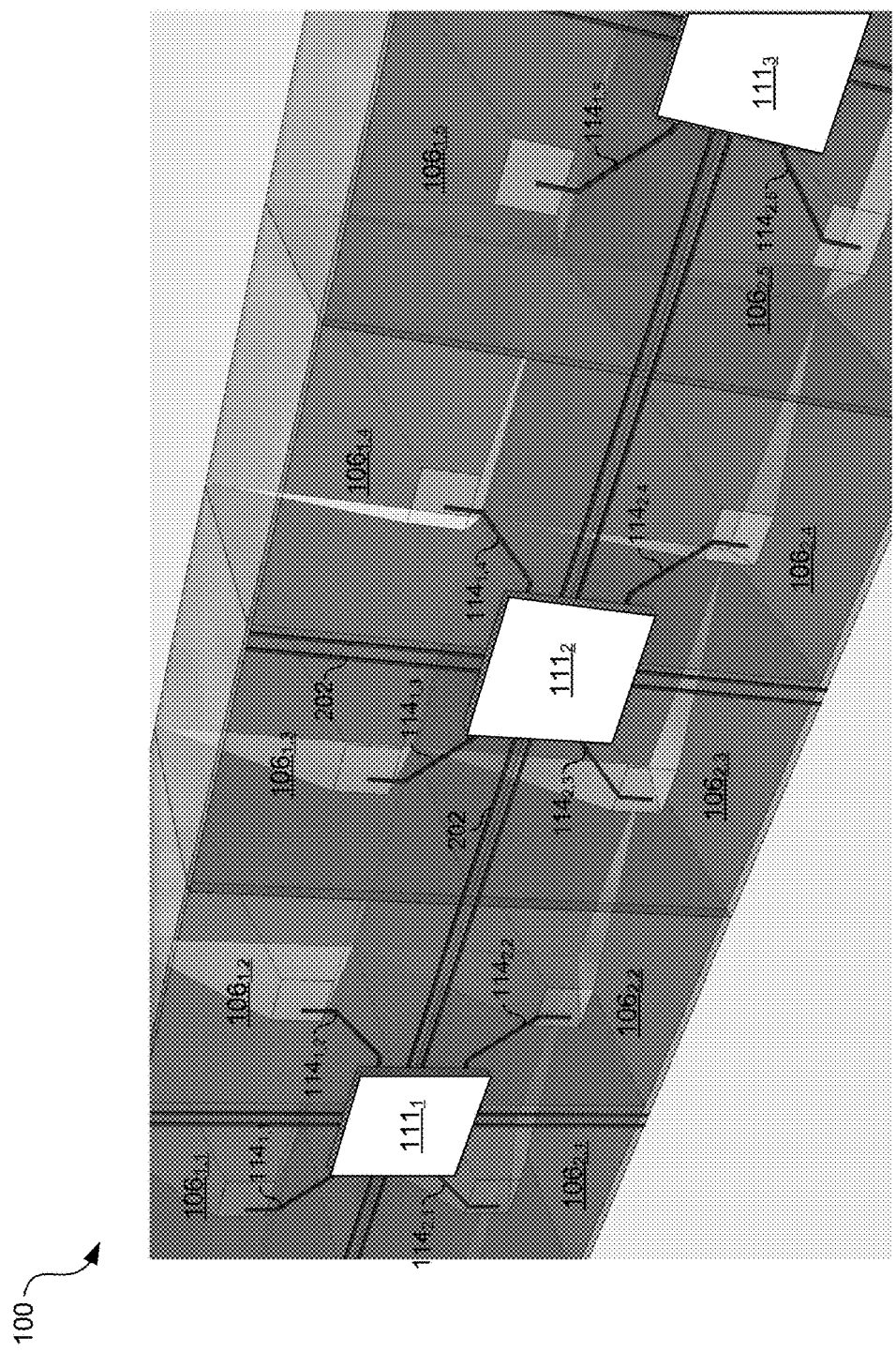

FIG. 1A-1C illustrate an example phased array system 100. FIG. 1A shows a front view and FIG. 1B shows a rear view.

The phased array system 100 comprises a plurality of antenna element elements arranged in a 2-dimensional array. Each antenna element is called out as $106_{i,j}$, where i is an integer corresponding to the antenna element's row index in the array ($0 <= i <= I$) and j is an integer corresponding to the antenna element's column index in the array ($0 <= j <= J$). In the example shown there are 8 antenna elements in each row and 8 antenna elements in each column, (i.e., I=8 and J=8), but in practice any number of antenna elements may be used.

The transmission and reception of signals by the system 100 may take advantage of beamforming and may be particularly configured for addressing possible issues (interference, etc.) and/or to provide added features, as described below.

The example phased array system 100 of FIGS. 1A-1C comprises an array of antenna elements $106_{i,j}$ (e.g., 64 elements in and 8×8 arrangement in the non-limiting example implementation illustrated in FIG. 1A), and one or more circuit assemblies 111 operable to transmit and/or receive signals via the array of antenna elements 106. The circuits 111 are operable to perform various signal processing related functions, as well as (optionally) other functions (e.g., control, storage, etc.) in support of the transmission and reception of signals via the antenna elements 106. In the example implementation shown, the system 100 comprises N (an integer) circuit assemblies $111_n$ ($1 <= n <= N$), each of which is operable to transmit and/or receive via a respective M (an integer) of the antenna elements 106 (N=16 and M=4 in the example shown).

As shown in the example implementation of FIG. 1C, antenna elements 106, of which two elements are shown in the cross-section slice depicted in FIG. 1C, the antenna elements 106 may be formed using carved horn structure 154, which may comprise polycarbonate (or other suitable material) substrate with conductive plating (e.g., aluminum) covering the surfaces forming the horn-shaped antenna elements. The antenna elements 106 may be mounted to a rigid base structure 156 (e.g., made of aluminum). In between the base structure 156 and the horn structure 154 may be one or more printed circuit board (PCB) 152 that provides RF traces $114_{i,j}$ interconnecting the circuit assemblies 111 and the antenna elements 106.

Phased array systems, such as the phased array system 100, offer various advantages and/or improvements over conventional antenna systems, such as dish-based designs. In this regard, because of their light weight, small form factor, and use of beam steering (e.g., beamforming), phased array systems are preferable over traditional dish-based designs. The elimination of dish and related components (e.g., the frequency duplexer, large power amplifier ("PA"), etc.) allows for installation at a wider range of sites, with lower cost of installation and operation (e.g., automatic alignment). Accordingly, phased array systems may be installed in a more flexible manner compared to dish-based designs, allowing installation options not possible or practical with traditional designs—e.g., mounting to sides of buildings, etc.

Phased array systems may have lower costs (e.g., fewer, smaller, and less expensive circuits, etc.). Also, the use of software-defined multiband array operation adds more flexibility. For example, the elimination of certain components (e.g., duplexers) allows the array-based systems to operate across a wide frequency range. Greater link reach may be achieved for the same dish size (due to, e.g., greater transmitter power, interference suppression, etc.). Operations may be improved (e.g., lower operating expenditures, greater frequency reuse, lower weight, etc.). Further, phased array systems may have superior thermal dissipation characteristics. In addition, the same core technology may be used for different interfaces and/or frequencies bands, allowing for common software and hardware development.

However, some issues may arise with phased arrays and use thereof. For example, one of the issues with phased arrays is the potential for LO spurs to appear in the transmitted signal because small LO spurs from each of the transceivers can add constructively to result in a relatively large LO spur. Aspects of this disclosure provide a way of suppressing such a spur.

Figure 2:
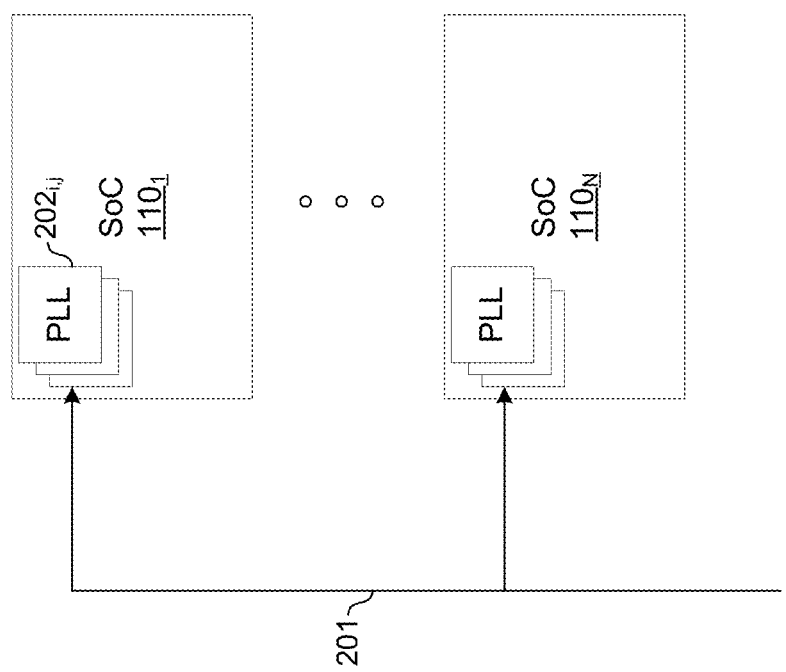
FIG. 2 shows phase synchronization of multiple transceiver circuits of a phased array system.

FIG. 2 shows phase synchronization of multiple transceiver circuits of a phased array system. In a phased array system, the signals transmitted via the various antenna elements 106 must have a determined phase with respect to each other in order to achieve a desired beam pattern. Accordingly, as shown in FIG. 2, a common reference signal 201 is provided to each of the circuits $110_1$-$110_N$. More specifically, in the example implementation shown, the reference clock is provided to one or more phase locked loops (PLL) 202 of each of the SoCs $110_1$-$110_N$.

Figure 3A:
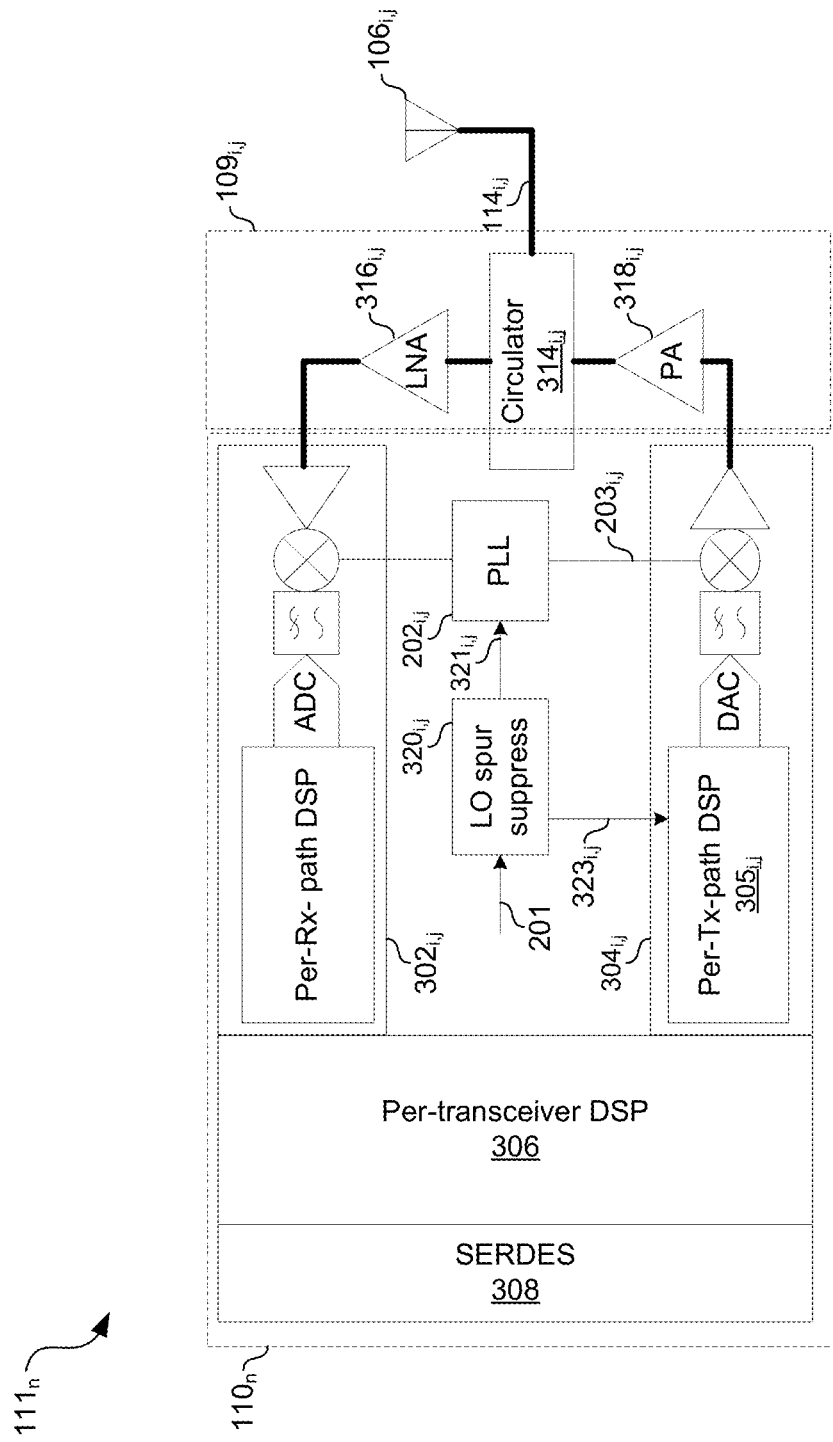
FIG. 3A shows an example transceiver circuit configured to suppress local oscillator spurs in accordance with aspects of this disclosure.
Figure 4A:
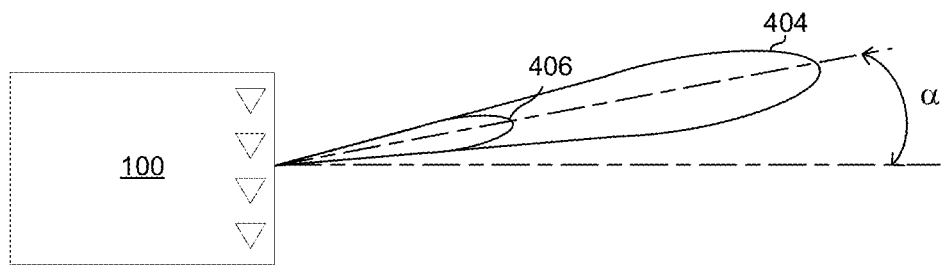
FIG. 4A shows an example antenna pattern of a phased array system without LO spur suppression as described in this disclosure.

As shown in FIG. 3A, each PLL $202_{i,j}$ generates a local oscillator signal $203_{i,j}$ that drives Tx front-end $304_{i,j}$. Because of nonidealities, some of the LO signal $203_{i,j}$ will be present at the antenna $106_{i,j}$. Consequently, if all the PLLs $202_{i,j}$ are locked to the same phase, then the LO spurs present at each of the antenna's $106_{i,j}$ may coherently combine and result in significant LO spurs at the same direction as the desired signal. For example, referring briefly to FIG. 4A, LO energy (lobe 406) is beamformed at the same angle, a, as the energy of the desired signal (lobe 404). This corresponds to a degradation of the desired signal. Therefore, in accordance with aspects of this disclosure, each circuit $110_n$ comprises a LO spur suppression circuit $320_{i,j}$ for each of its transmit front-ends $304_{i,j}$. FIG. 3A also illustrates one or more per-Rx-path digital signal processors (DSP) $302_{i,j}$, one or more per-transceivers DSP 306, a serializer/deserializer (SERDES) 308, one or more Low-noise amplifiers (LNA) $316_{i,j}$, one or more power amplifiers (PA) $318_{i,j}$, one or more circuits $109_{i,j}$, and one or more RF traces $114_{i,j}$.

Figure 4B:
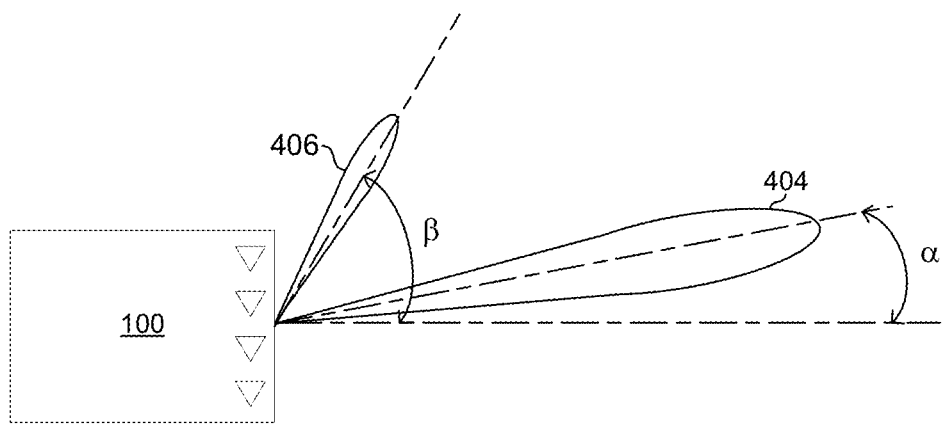
FIG. 4B shows an example antenna pattern of a phased array system in which LO spur suppression as described in this disclosure has been used to beamform LO energy in an innocuous direction.
Figure 4C:
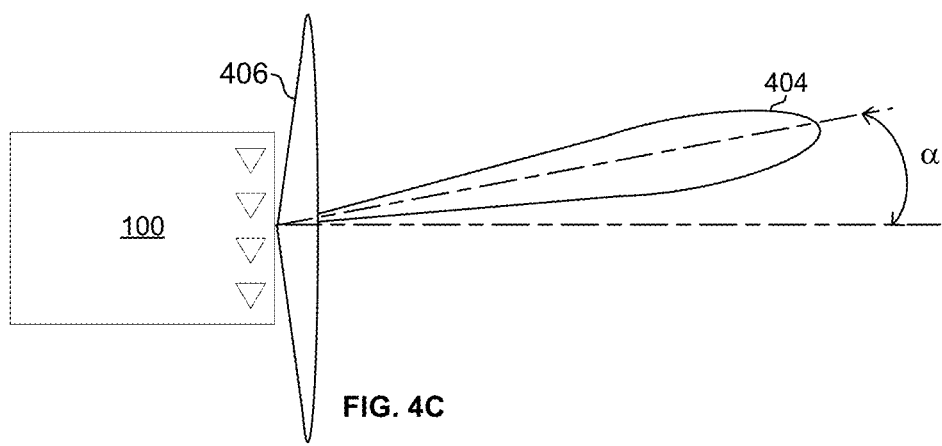
FIG. 4C shows an example antenna pattern of a phased array system in which LO spur suppression as described in this disclosure has been used to spatially spread LO energy.

The LO spur suppression circuit $320_{i,j}$ is configured to: (1) adjust the phase of the LO signal $203_{i,j}$ and (2) make a corresponding adjustment to the phase of the digital to-be-transmitted baseband signal such that the desired signal coherently combines in a desired direction and the LO energy either: (1) coherently combines in a different direction (e.g., in an innocuous direction where it will not interfere with anyone); or (2) is spatially spread out such that it is relatively low energy in any given direction. The former is illustrated by FIG. 4B in which the LO energy (represented by lobe 406) is directed at angle β, and the latter is illustrated by FIG. 4C in which the LO energy is approximately uniformly spread out over a range of angles.

As just one non-limiting example, each LO signal $201_{i,j}$ may be shifted by an offset determined based on that PLL's indices i and j, and the digital baseband signal of Tx front-end $304_{i,j}$ may be shifted by a corresponding compensating offset determined based on its indices i and j. As another non-limiting example, each LO signal $201_{1,1}$ may be shifted by a random offset and the digital baseband signal of Tx front-end $304_{i,j}$ may be shifted by a corresponding compensating offset.

FIG. 3B illustrates suppression of local oscillator spurs through use of a phase adjustment value, in accordance with aspects of this disclosure. Shown are example details of the LO spur suppression circuitry $320_{i,j}$ and the per-Tx-path DSP circuitry $305_{i,j}$. The example LO spur suppression circuitry $320_{i,j}$ comprises phase shifter circuitry $350_{i,j}$ and phase adjustment value generator circuitry $352_{i,j}$. The per-Tx-path DSP circuitry $305_{i,j}$ comprises beamforming coefficients generator circuitry $354_{i,j}$ and beamforming circuitry $362_{i,j}$.

The phase shifter circuitry $350_{i,j}$ is operable to adjust the phase of the reference signal 201 by an amount equal to the phase adjustment value $323_{i,j}$.

The phase adjustment value generator circuitry $352_{i,j}$ is operable to generate a phase adjustment value $323_{i,j}$ that, as described above, helps mitigate the impact of the LO signal leaking through to the transmitter output. The phase adjustment value $323_{i,j}$ may be determined based on the location of antenna element $106_{i,j}$ within the array 100. Accordingly, in the example shown, the phase adjustment value generator circuitry $352_{i,j}$ comprises a register $358_{i,j}$ which stores a representation of the location of antenna element $106_{i,j}$ (e.g., stores the indices i and j) for use in generating the phase adjustment value $323_{i,j}$. The register $358_{i,j}$, may, for example, be programmed during factory calibration of the antenna system 100.

The beamforming coefficients generator circuitry $354_{i,j}$ is operable to generate beamforming coefficient(s) $356_{i,j}$ to be used by the beamforming circuitry $362_{i,j}$, for beamforming of the digital baseband signal prior to upconversion using the local oscillator signal $321_{i,j}$ and transmission of the upconverted signal via antenna element $106_{i,j}$. The beamforming coefficients $356_{i,j}$ may be determined based on the location of antenna element $106_{i,j}$ within the array 100. Accordingly, in the example shown, the beamforming coefficients generator circuitry $354_{i,j}$ comprises a register $360_{i,j}$ which stores a representation of the location of antenna element $106_{i,j}$ (e.g., stores the indices i and j) for use in generating the beamforming coefficient(s) $356_{i,j}$. The register $360_{i,j}$, may, for example, be programmed during factory calibration of the antenna system 100. Additionally, or alternatively, the register 360 may store reference beamforming coefficients which, if applied to the signal to be transmitted, would result in the main lobe 404 pointed in the desired direction when $321_{i,j}$=201 but result in the main lobe pointed in an incorrect direction when $321_{i,j}$≠201. Thus, generation of the beamforming coefficients may comprise adjusting the reference beamforming coefficients based on the phase adjustment value $323_{i,j}$ to compensate for the adjustment of the local oscillator signal such that the main lobe points in the desired direction.

In accordance with an example implementation of this disclosure, a system comprises local oscillator spur suppression circuitry (e.g., $320_{i,j}$), local oscillator generator circuitry (e.g., $202_{i,j}$), and beamforming circuitry (e.g., $354_{i,j}$ and $362_{i,j}$). The local oscillator spur suppression circuitry is operable to generate a phase adjustment value (e.g., $323_{i,j}$). The local oscillator generator circuitry is operable to generate a local oscillator signal (e.g., $321_{i,j}$) at a determined phase equal to a reference phase (e.g., phase of 201) offset by the phase adjustment value. The beamforming circuitry is operable to receive the phase adjustment value, and generate a beamforming coefficient to be applied to a signal (e.g., $364_{i,j}$) that is to be upconverted by the local oscillator signal and transmitted via an antenna element (e.g., $106_{i,j}$) of a phased array (e.g., 100), wherein the generation of the beamforming coefficient is based on the phase adjustment value and a location of the antenna element within the phased array. The location of the antenna element is indicated by one or more array indices assigned to the antenna element. Each of the one or more indices may be associated with a respective axis along which antenna elements of the phased array are distributed (e.g., i with the x axis and j with the y axis). The generation of the phase adjustment value may be based on a desired directionality (e.g., angle β) of an antenna lobe (e.g., 406) that results from leakage of the local oscillator signal into the transmitted signal. The local oscillator spur suppression circuit may be operable to vary the phase adjustment value over time such that an antenna lobe that results from leakage of the local oscillator signal into the transmitted signal is spread over a range of angles over time (e.g., 406 in FIG. 4C). The local oscillator spur suppression circuitry may comprise phase shifter circuitry (e.g., $350_{i,j}$) operable to shift a phase of a reference signal (e.g., 201) by the phase adjustment value to generate a phase-adjusted reference signal (e.g., $321_{i,j}$). The local oscillator generation circuitry may comprise a phase locked loop (e.g., 201) operable to phase lock to the phase-adjusted reference signal. The phase adjustment value may be a pseudorandom value. The generation of the beamforming coefficient may comprise adjustment of a reference beamforming coefficient by an amount corresponding to the phase adjustment value. The reference beamforming coefficient may correspond to a main antenna lobe in a desired direction when the phase adjustment value is zero. The antenna element may be a horn and the phased array may comprises a plurality of horns formed in a single piece of material (e.g., a single piece of plastic coated with a conductive material).

As used herein the terms "circuits" and "circuitry" refer to physical electronic components (e.g., hardware), and any software and/or firmware ("code") that may configure the hardware, be executed by the hardware, and or otherwise be associated with the hardware. As used herein, for example, a particular processor and memory (e.g., a volatile or non-volatile memory device, a general computer-readable medium, etc.) may comprise a first "circuit" when executing a first one or more lines of code and may comprise a second "circuit" when executing a second one or more lines of code. Additionally, a circuit may comprise analog and/or digital circuitry. Such circuitry may, for example, operate on analog and/or digital signals. It should be understood that a circuit may be in a single device or chip, on a single motherboard, in a single chassis, in a plurality of enclosures at a single geographical location, in a plurality of enclosures distributed over a plurality of geographical locations, etc. Similarly, the term "module" may, for example, refer to a physical electronic components (e.g., hardware) and any software and/or firmware ("code") that may configure the hardware, be executed by the hardware, and or otherwise be associated with the hardware.

As used herein, circuitry or module is "operable" to perform a function whenever the circuitry or module comprises the necessary hardware and code (if any is necessary) to perform the function, regardless of whether performance of the function is disabled or not enabled (e.g., by a user-configurable setting, factory trim, etc.).

As used herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As used herein, the term "exemplary" means serving as a non-limiting example, instance, or illustration. As used herein, the terms "for example" and "e.g." set off lists of one or more non-limiting examples, instances, or illustrations.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
local oscillator spur suppression circuitry operable to generate a phase adjustment value in view of a plurality of spurs associated with a plurality of phase locked loops (PLL);
local oscillator generation circuitry operable to generate a local oscillator signal at a determined phase, the determined phase equal to a (a) reference phase that is offset by (b) the phase adjustment value; and
beamforming circuitry operable to:
receive the phase adjustment value; and
generate a beamforming coefficient to apply to a to-be-transmitted signal that is to be upconverted by the local oscillator signal and transmitted via an antenna element of a phased array, wherein the generation of the beamforming coefficient is to reduce an effect of the plurality of spurs based on the phase adjustment value and a location of the particular antenna element within the phased array.

2. The system of claim 1, wherein:
the location of the antenna element is indicated by one or more array indices assigned to the antenna element; and
each of the one or more array indices is associated with a respective axis along which antenna elements of the phased array are distributed.

3. The system of claim 1, wherein the generation of the phase adjustment value is based on a desired directionality of an antenna lobe that results from leakage of the local oscillator signal into the to-be-transmitted signal.

4. The system of claim 1, wherein the local oscillator spur suppression circuitry is operable to vary the phase adjustment value over time such that an antenna lobe that results from leakage of the local oscillator signal into the to-be-transmitted signal is spread over a range of angles over time.

5. The system of claim 1, wherein the local oscillator spur suppression circuitry comprises a phase shifter circuitry operable to shift a phase of a reference signal by the phase adjustment value to generate a phase-adjusted reference signal.

6. The system of claim 5, wherein the local oscillator generation circuitry comprises a phase locked loop operable to phase lock to the phase-adjusted reference signal.

7. The system of claim 1, wherein the phase adjustment value is a pseudorandom value.

8. The system of claim 1, wherein the generation of the beamforming coefficient comprises adjustment of a reference beamforming coefficient by an amount corresponding to the phase adjustment value.

9. The system of claim 8, wherein the reference beamforming coefficient corresponds to a main antenna lobe in a desired direction when the phase adjustment value is zero.

10. The system of claim 1, wherein the antenna element is a horn and the phased array comprises a plurality of horns formed in a single piece of material.

11. A method comprising:
generating, by local oscillator spur suppression circuitry, a phase adjustment value;
generating, by local oscillator generator circuitry, a local oscillator signal at a determined phase, the determined phase equal to a reference phase that is offset by the phase adjustment value in view of a plurality of spurs associated with a plurality of phase locked loops (PLL); and
receiving, by beamforming circuitry, the phase adjustment value;
generating, by the beamforming circuitry, a beamforming coefficient to be applied to a to-be-transmitted signal that is to be upconverted by the local oscillator signal and transmitted via an antenna element of a phased array, wherein the generating of the beamforming coefficient is to reduce an effect of the plurality of spurs based on the phase adjustment value and a location of the antenna element within the phased array; and
applying the beamforming coefficient to the signal to be upconverted.

12. The method of claim 11, wherein:
the location of the antenna element is indicated by one or more array indices assigned to the antenna element; and
each of the one or more array indices is associated with a respective axis along which antenna elements of the phased array are distributed.

13. The method of claim 11, wherein the generating the phase adjustment value is based on a desired directionality of an antenna lobe that results from leakage of the local oscillator signal into the to-be-transmitted signal.

14. The method of claim 11, comprising carrying, by the local oscillator spur suppression circuitry, the phase adjustment value over time such that an antenna lobe that results from leakage of the local oscillator signal into the to-be-transmitted signal is spread over a range of angles over time.

15. The method of claim 11, wherein the local oscillator spur suppression circuitry comprises a phase shifter circuitry and the method comprises the phase shifter shifting a phase of a reference signal by the phase adjustment value to generate a phase-adjusted reference signal.

16. The method of claim 15, wherein the local oscillator generation circuitry comprises a phase locked loop and the method comprises the phase locked loop locking to the phase-adjusted reference signal.

17. The method of claim 11, wherein the phase adjustment value is a pseudorandom value.

18. The method of claim 11, wherein the generating the beamforming coefficient comprises adjusting a reference beamforming coefficient by an amount corresponding to the phase adjustment value.

19. The method of claim 18, wherein the reference beamforming coefficient corresponds to a main antenna lobe in a desired direction when the phase adjustment value is zero.

20. The method of claim 11, wherein the antenna element is a horn and the phased array comprises a plurality of horns formed in a single piece of material.

* * * * *